(12) United States Patent
Shneyder et al.

(10) Patent No.: US 7,446,859 B2
(45) Date of Patent: Nov. 4, 2008

(54) APPARATUS AND METHOD FOR REDUCING CONTAMINATION IN IMMERSION LITHOGRAPHY

(75) Inventors: Dmitriy Shneyder, Hopewell Junction, NY (US); Raschid J. Bezama, Putnam Valley, NY (US); Dario L. Goldfarb, Mohegan Lake, NY (US); Kafai Lai, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 265 days.

(21) Appl. No.: 11/307,230

(22) Filed: Jan. 27, 2006

(65) Prior Publication Data

US 2007/0177124 A1    Aug. 2, 2007

(51) Int. Cl.
G03B 27/58 (2006.01)
G03B 27/62 (2006.01)
G03B 27/42 (2006.01)

(52) U.S. Cl. .............................. 355/72; 355/75; 355/53

(58) Field of Classification Search .................. 355/72, 355/73, 75; 269/21; 248/362, 363
See application file for complete search history.

(56) References Cited

U.S. PATENT DOCUMENTS

| | | | |
|---|---|---|---|
| 6,781,670 B2 | 8/2004 | Krautschik | |
| 6,788,477 B2* | 9/2004 | Lin | 359/820 |
| 2004/0160582 A1* | 8/2004 | Lof et al. | 355/30 |
| 2005/0122505 A1* | 6/2005 | Miyajima | 355/72 |
| 2005/0123863 A1 | 6/2005 | Chang et al. | |
| 2005/0168713 A1 | 8/2005 | Vogel et al. | |
| 2005/0237501 A1* | 10/2005 | Furukawa et al. | 355/30 |
| 2005/0259236 A1* | 11/2005 | Straaijer | 355/72 |

* cited by examiner

*Primary Examiner*—Diane I. Lee
*Assistant Examiner*—Steven H Whitesell-Gordo
(74) *Attorney, Agent, or Firm*—Cantor Colburn LLP; Rosa Yaghmour (57) ABSTRACT

An apparatus for reducing contamination in immersion lithography includes a wafer chuck assembly having a wafer chuck configured to hold a semiconductor wafer on a support surface thereof. The wafer chuck has a gap therein, the gap located adjacent an outer edge of the wafer, and the gap containing a volume of immersion lithography fluid therein. A fluid circulation path is configured within the wafer chuck so as to facilitate the radial outward movement of the immersion lithography fluid in the gap, thereby maintaining a meniscus of the immersion lithography fluid at a selected height with respect to a top surface of the semiconductor wafer.

10 Claims, 11 Drawing Sheets

APPARATUS AND METHOD FOR REDUCING CONTAMINATION IN IMMERSION LITHOGRAPHY

BACKGROUND

The present invention relates generally to semiconductor device manufacturing, and, more particularly, to an apparatus and method for reducing contamination in immersion lithography.

Lithography is one of the most important techniques utilized in semiconductor manufacturing, and is particularly used to define patterns, such as those employed in a wiring layer patterning process or a doped-region defining process for example. A lithography process generally includes an exposure step and a development step, wherein the exposure step utilizes a light source to irradiate a photoresist layer directly or through a photomask to induce chemical reactions in exposed portions. The development step is conducted to remove the exposed portion in positive resist (or the unexposed portion in negative resist) and form photoresist patterns, thus completing the transfer of photomask patterns or virtual patterns to the resist material.

Immersion lithography (IL) is rapidly emerging as the technique of choice for printing sub-100 nm photoresist structures while still using 193 nm exposure sources. By increasing the index of refraction of the medium between the last lens element of the exposure tool and the resist-coated substrate, the numerical aperture of the lithography system is increased and thus the printable minimum feature size for a given exposure wavelength can be reduced in accordance with the well-known Rayleigh equation. Accordingly, existing immersion lithography processes are conducted in a liquid phase environment, and thus a higher resolution is achieved since the refractive index of the immersion liquid (e.g., ultra pure water) is higher than that of air (about 1.47 versus 1.0). Therefore, the dimensions of the formed IC devices can be further scaled using an immersion lithography technique.

However, one drawback associated with immersion lithography stems from the physical contact between the immersion fluid and the resist material, which can potentially lead to partial image integrity failure and contamination embedded in or below the resist. More specifically, evaporation of the immersion fluid off the resist surface on the trailing edge of the shower head during exposure can lead to the concentration of trace contaminants, which can be transferred during the subsequent processing steps and finally affect device yield and performance in a severe manner. For example, traces of colloidal silica present in the immersion fluid can be concentrated in areas where immersion fluid evaporation is verified.

In addition, the trailing edge of the water pool contained by the showerhead can easily leave behind a residual immersion fluid layer, or eventually break down into droplets of variable size, under specific scanning conditions. For example, with typical wafer stage speeds in the order of 500-1000 mm/s, any discontinuity present on the scanned surface will affect the mechanical stability of the fluid pool and lead to the formation of fluid droplets. Similarly, a low contact angle between the immersion fluid and the scanned surface will increase the shape and size of the trailing fluid edge, thus increasing the chances of forming a residual fluid layer. Either the presence of a residual fluid layer or droplets can easily lead to the formation of defects. Extractable components from the topcoat or resist layers (e.g., oligomeric material, photoacid generator, photogenerated acid, base quencher) can be extracted by the immersion fluid and result in micromasking or watermark-like defects upon fluid drying.

Accordingly, it would be desirable to be able to reduce or eliminate altogether the contamination left behind by immersion lithography.

SUMMARY

The foregoing discussed drawbacks and deficiencies of the prior art are overcome or alleviated by an apparatus for reducing contamination in immersion lithography. In an exemplary embodiment, the apparatus includes a wafer chuck assembly including a wafer chuck configured to hold a semiconductor wafer on a support surface thereof. The wafer chuck has a gap therein, the gap located adjacent an outer edge of the wafer, and the gap containing a volume of immersion lithography fluid therein. A fluid circulation path is configured within the wafer chuck so as to facilitate the radial outward movement of the immersion lithography fluid in the gap, thereby maintaining a meniscus of the immersion lithography fluid at a selected height with respect to a top surface of the semiconductor wafer.

In another embodiment, a wafer chuck assembly includes a first chuck section configured to hold a semiconductor wafer on a support surface thereof, and a second chuck section removably attached to the first chuck section. The first chuck section has a gap therein, the gap located adjacent an outer edge of the wafer, and the gap containing a volume of immersion lithography fluid therein. A fluid circulation path is configured within the first chuck section so as to facilitate the radial outward movement of the immersion lithography fluid in the gap, thereby maintaining a meniscus of said immersion lithography fluid at a selected height with respect to a top surface of the semiconductor wafer.

In still another embodiment, a method for reducing contamination in immersion lithography includes retaining a semiconductor wafer on a support surface of a wafer chuck, the wafer chuck having a gap therein, the gap located adjacent an outer edge of the wafer, and the gap containing a volume of immersion lithography fluid therein. A fluid circulation path is provided within the wafer chuck so as to facilitate the radial outward movement of the immersion lithography fluid in the gap, thereby maintaining a meniscus of the immersion lithography fluid at a selected height with respect to a top surface of the semiconductor wafer.

BRIEF DESCRIPTION OF THE DRAWINGS

Referring to the exemplary drawings wherein like elements are numbered alike in the several Figures.

DETAILED DESCRIPTION

Disclosed herein is an apparatus and methodology for reducing contamination associated with immersion lithography. Generally speaking, wafer contamination is left behind near the wafer edge, and in a manner that such contamination is produced as a result of interaction of the immersion fluid with the topography between the wafer edge and the chuck. Recent simulations have shown that reducing topography on the surface covered by the tool showerhead helps to maintain the meniscus, and to avoid bubble formation. Thus, it is advantageous to artificially extend the wafer surface, so as to make the transition between the wafer and the chuck as flat as possible without sharp transitions.

As is outlined in greater detail hereinafter, the exemplary embodiments herein maintain fluid meniscus integrity in the topography gap of a wafer chuck by introducing an internal fluid circulation path within the chuck. The circulation path includes the gap itself, thus flowing immersion fluid through the gap (between the outer edge of the wafer and the chuck) radially outwards, and maintaining the water level at same height as the wafer surface. Moreover, the fluid level may be maintained at the same height as wafer surface with active or passive control of the fluid circulation path. It should be noted that any suitable fluid may be used for the fluid circulation path within the chuck, so long as it optically matches the immersion fluid of the lithography process and does not damage the surrounding surfaces of the wafer.

Figure 1:
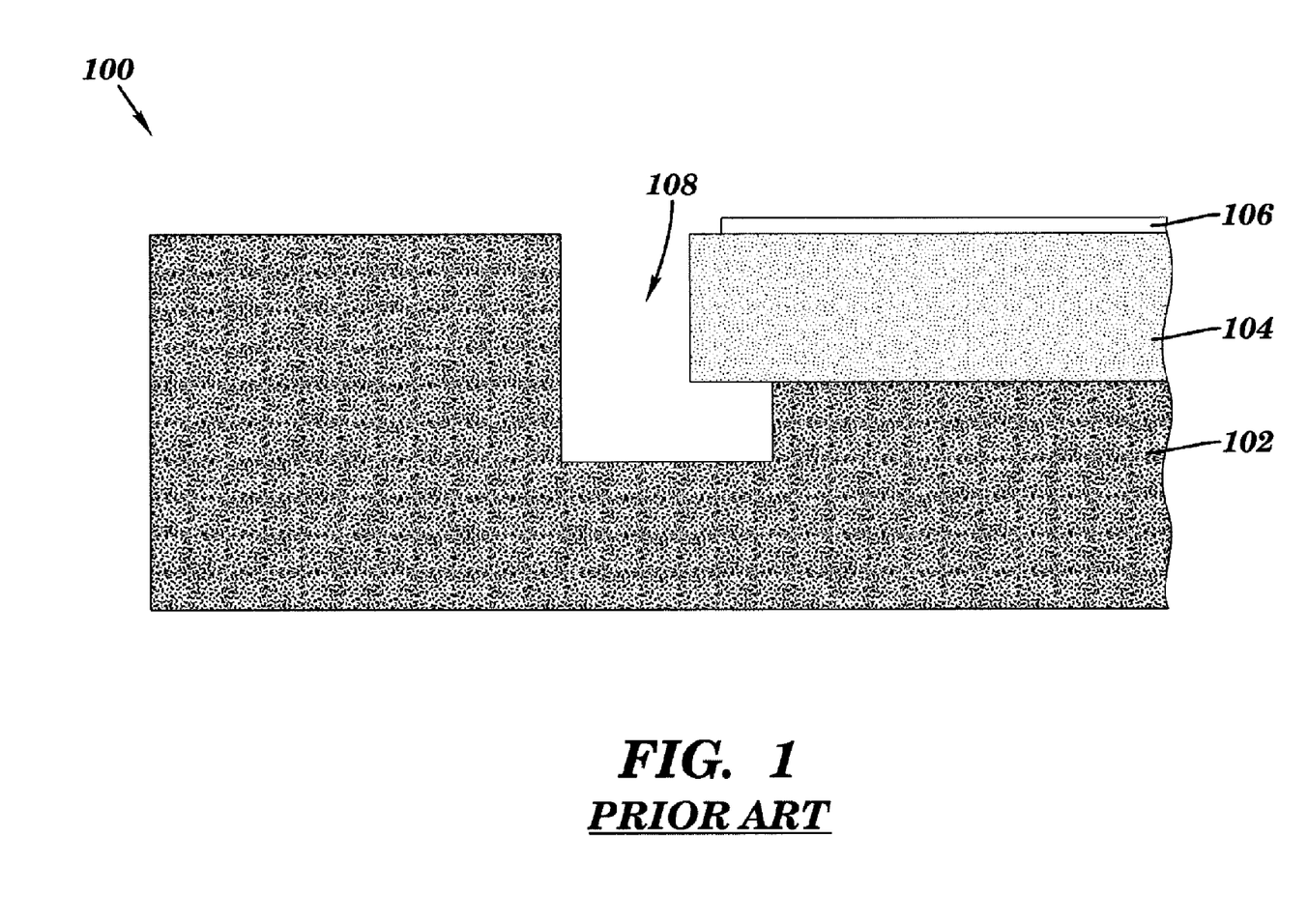
FIG. 1 is a partial cross-sectional view of a portion of a conventional chuck assembly that may be used in conjunction with immersion lithography.

Referring initially to FIG. 1, there is shown a partial cross-sectional view of a portion of a chuck assembly 100 that may be used in conjunction with, for example, immersion lithography. As is shown, a wafer chuck 102 has a semiconductor wafer 104 held thereupon, with the wafer 104 depicted as having a thin layer of photoresist material 106 formed thereon. It will be noted that the relative dimensions of the chuck 102, wafer 104 and resist layer 106 are not to scale and are depicted as such for illustrative purposes only. However, as is shown in FIG. 1, there exists a substantial topography at the outer edge of the wafer 104 as a result of the air gap 108 formed within the chuck 102.

Figure 2:
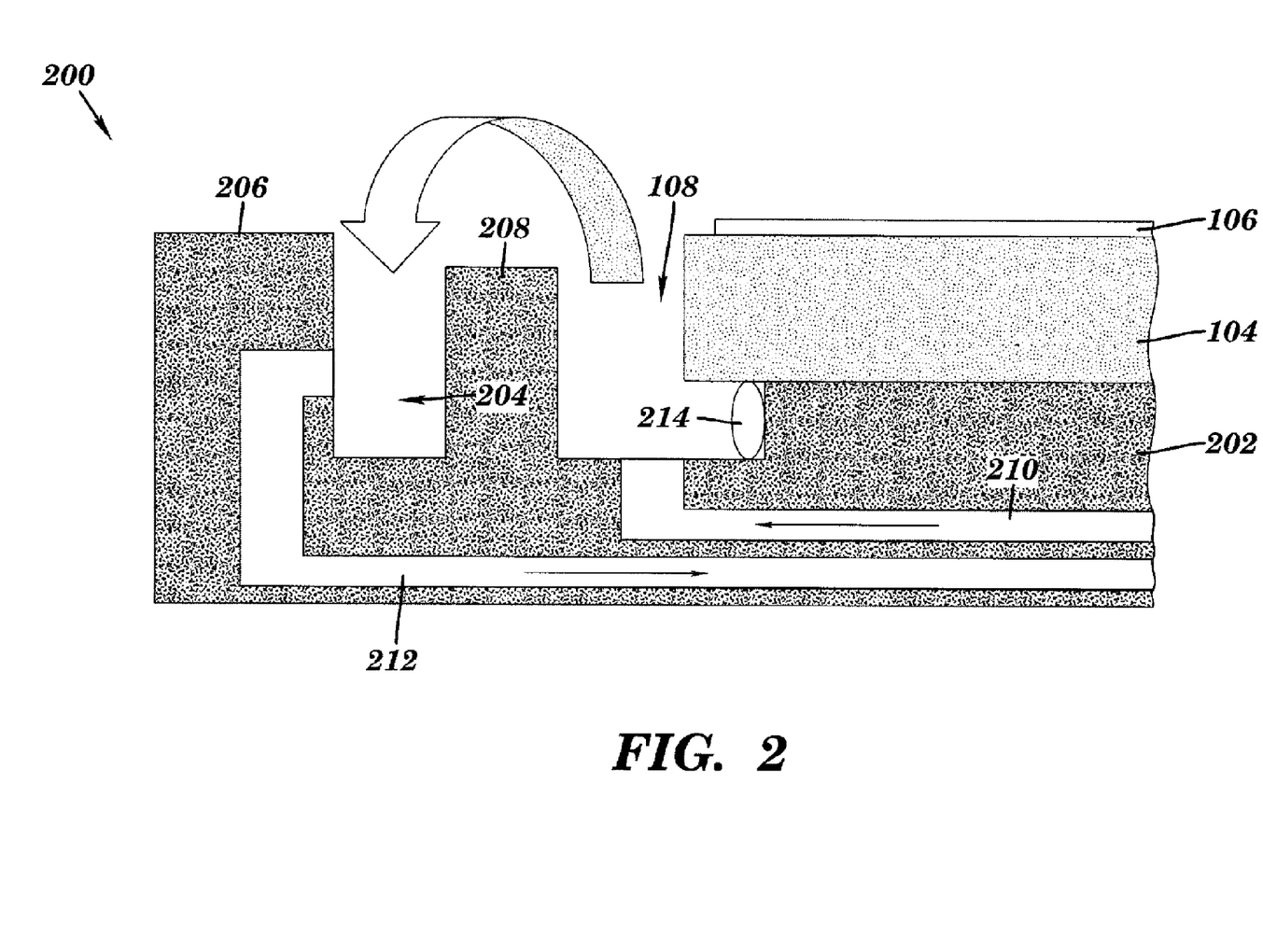
FIG. 2 is a partial cross-sectional view of a chuck assembly configured for immersion lithography, in accordance with an exemplary embodiment of the invention.

Accordingly, FIG. 2 is a partial cross-sectional view of a chuck assembly 200 configured for immersion lithography, in accordance with an exemplary embodiment of the invention. As is shown, a wafer chuck 202 is modified to include an immersion fluid supply line 210 and an outer channel 204 that facilitates the outward flow of immersion fluid from the gap 108, thus forming a liquid surface that extends from the edge of the wafer 104 top surface to the wafer chuck surface, thereby filling the air gap with the added fluid. While the outermost portion 206 of the chuck has a height that roughly correlates to the height of the wafer 104, it will be noted that the intermediate portion (lip) 208 of the chuck between the gap 108 and the outer channel 204 has a height that is lower than the top of the outermost portion 206 and the wafer 104. This allows fluid to travel over the top of the lip 208, leading to a reduction in splashing and thus contamination.

In addition to the outer channel 204, a fluid circulation path is also formed within the chuck 202. Particularly, an inlet path 210 allows a pressurized source of fluid to flow into the bottom of the gap 108, while a negative pressure return path 212 originates from a sidewall formed within the outer channel 204. In an exemplary embodiment, the fluid used and circulated through the fluid circulation path has the same optical characteristics as that used for the immersion lithography, so as to avoid any changes in optical characteristics from any mixing therebetween. Furthermore, in order to prevent optical fluid from entering beneath the surface of the wafer 104 where it contacts the chuck 202, a seal 214 (e.g., an O-ring) is positioned between the bottom of the wafer and the bottom of the gap 108. As will be discussed in further detail hereinafter, a variety of seal shapes and materials may be implemented.

Figure 3:
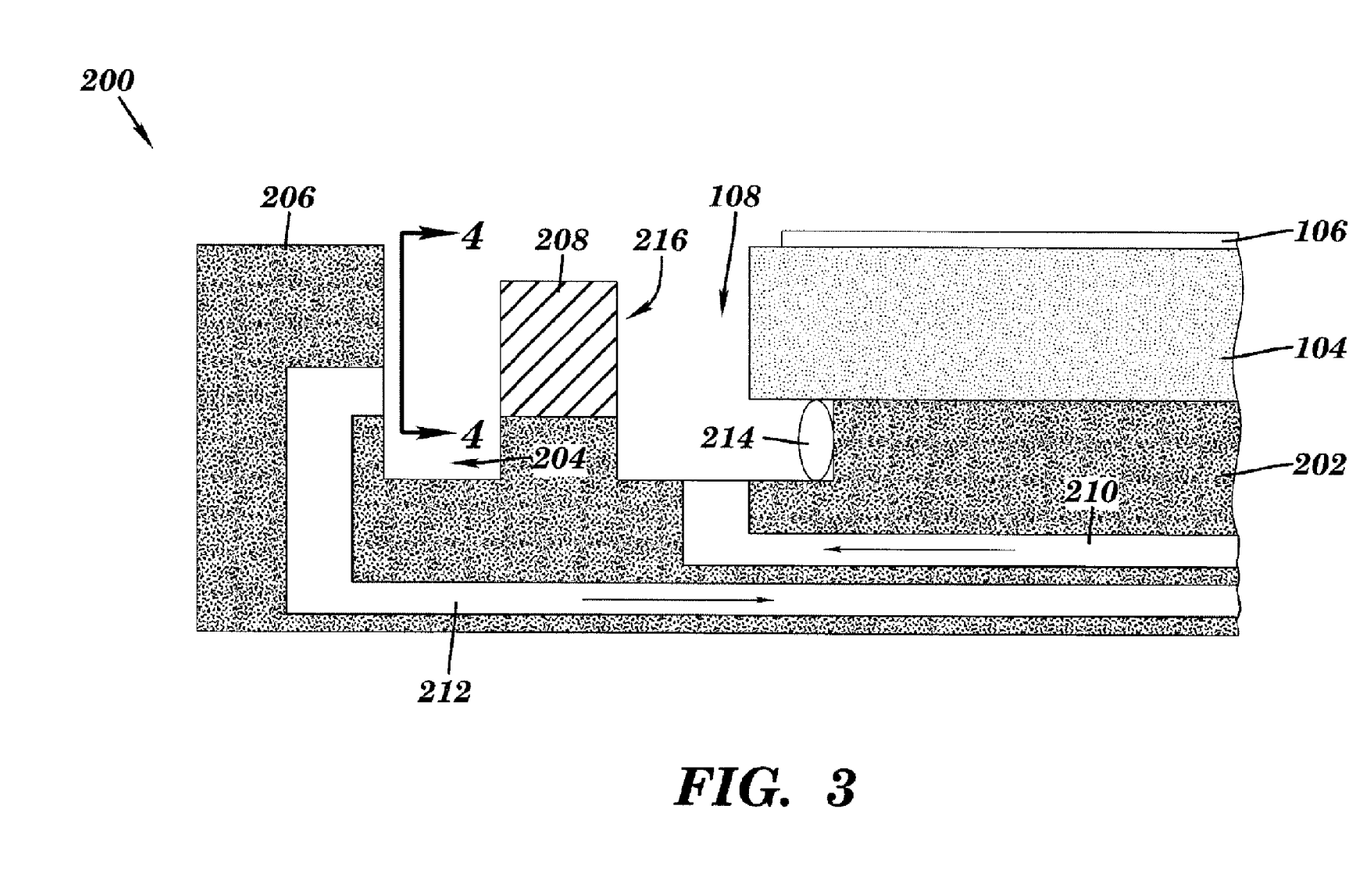
FIG. 3 illustrates an optional groove feature that may be introduced within the chuck assembly of FIG. 2.
Figure 4:
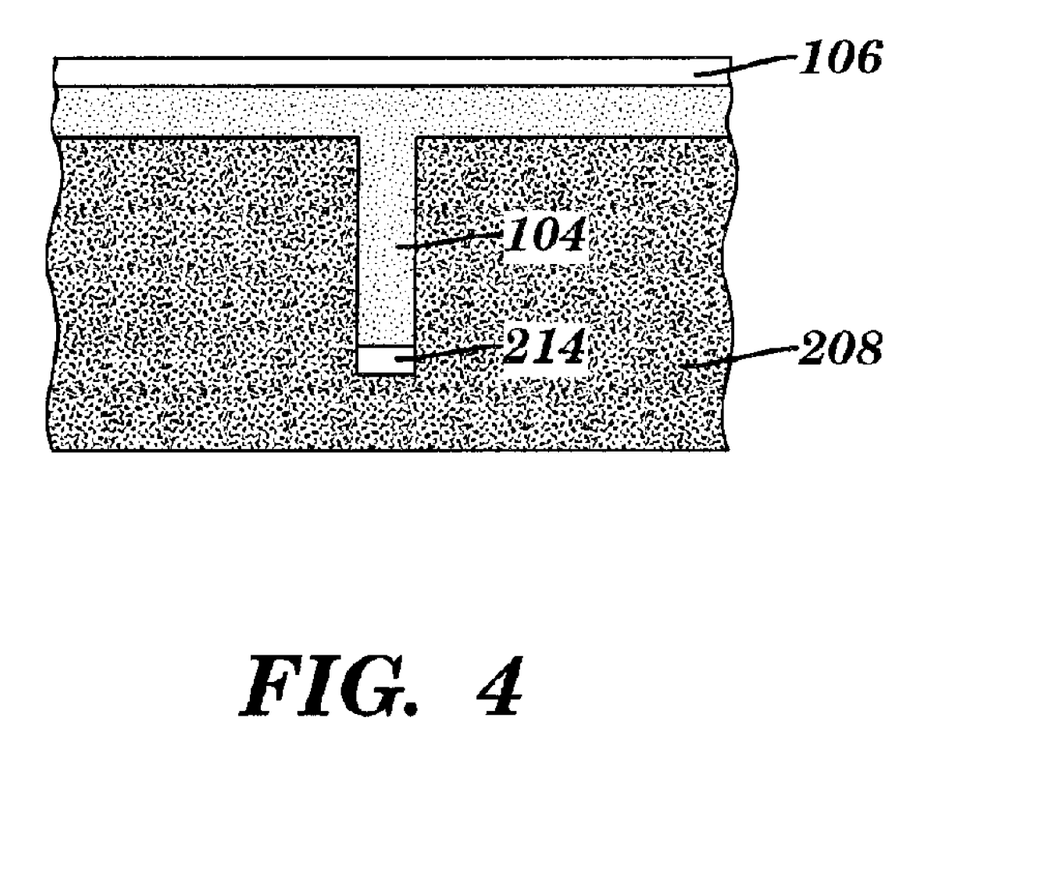
FIG. 4 is a partial side cross-sectional view of the optional groove feature, taken along the lines 4-4 of FIG. 3.

FIG. 3 illustrates an optional feature that may be introduced within the chuck assembly 200 of FIG. 2, for the purpose of eliminating waves as the chuck moves about. More specifically, a plurality of side grooves 216 is formed (at periodic intervals) within the lip 208 of the chuck 202. Thereby, an additional level of fluid level control is achieved since, in addition to flowing over the top of the lip, the optical fluid can also flow through each of the side grooves 216. FIG. 4 is a partial side cross-sectional view, taken along the lines 4-4 of FIG. 3, illustrating in further detail one of the grooves 216 formed in the lip 208.

Figure 5:
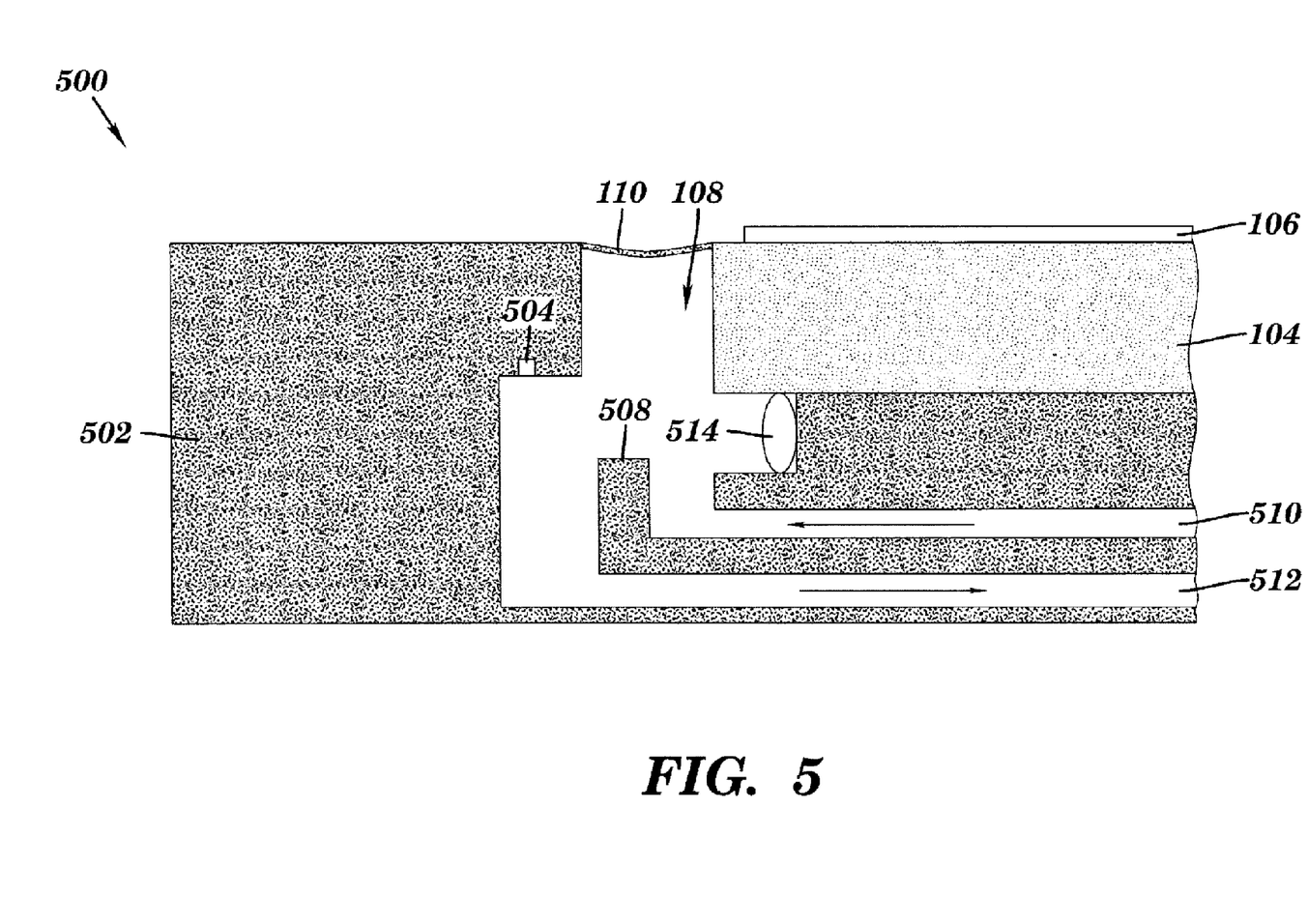
FIG. 5 is a partial cross-sectional view of a chuck assembly configured for immersion lithography, in accordance with an alternative embodiment of the invention.

Referring now to FIG. 5, there is shown a partial cross-sectional view of a chuck assembly 500 configured for immersion lithography, in accordance with an alternative embodiment of the invention. As is shown, a wafer chuck 502 is modified to include an interior fluid circulation path. However, in contrast to the embodiment of FIGS. 2 through 5, the interior fluid circulation path of the chuck 502 in FIG. 5 is configured directly beneath the existing gap 108. As such, when immersion fluid within the gap 108 is accelerated, it is caused to flow from the direction of the pressurized inlet path 510, over a lip 508 beneath the gap 108, to the return path 512. Moreover, the fluid level of the embodiment of FIG. 5 is maintained through an active control approach in that a pressure sensor 504 is configured within the chuck 502 in order to sense the fluid pressure within the path. In this manner, the positive pressure of the inlet path 510 and the negative pressure of the return path 512 may be independently controlled to adjust for changes in pressure in the immersion fluid in the gap, thereby maintaining water level 110 and meniscus integrity of the passing immersion fluid.

One particular advantage associated with the embodiment of FIG. 5 is a simpler flow of fluid within the chuck 502. As is the case with FIG. 2, the chuck 502 also includes a sealing ring 514 to prevent immersion fluid from coming between the bottom surface of the wafer 104 and the chuck 502.

Figure 6:
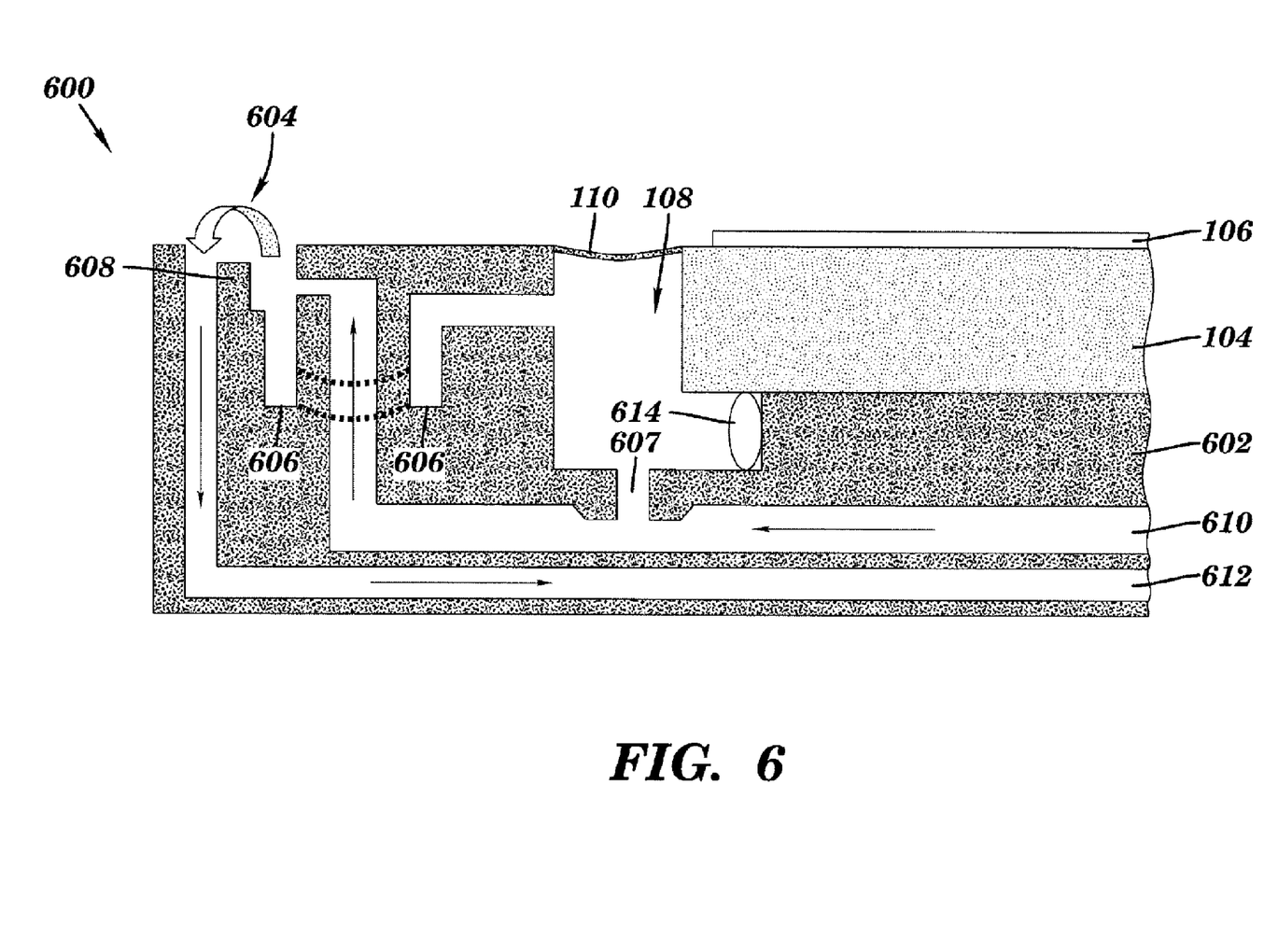
FIG. 6 is partial cross-sectional view of a chuck assembly configured for immersion lithography, in accordance with still another embodiment of the invention.

In addition to active control, the fluid level within an immersion lithography chuck assembly can also be maintained through passive control means. For example, FIG. 6 is partial cross-sectional view of a chuck assembly 600 configured for immersion lithography, in accordance with still another embodiment of the invention. As is shown, the passive control embodiment provides a modified wafer chuck 602 that incorporates a first water column (i.e., the existing gap 108) and a second column 604 formed at an outer location with respect to the radius of the chuck 602. Similar to the earlier embodiments, a fluid circulation path is once again provided within the chuck 602 for maintaining the integrity of the fluid meniscus 110.

The fluid circulation path, including inlet path 610 and return path 612, is directed through the second column 604, which further includes an overflow lip 608. Thus, fluid traveling in an outward direction will flow over the lip 608 and into the return path 612 of the second column 604. The passive control of the fluid level in the gap 108 is achieved through the control of the second column 604, since the gap 108 is fluidly connected to the second column 604 through passage 606 formed within the chuck 602. In addition, a Venturi tube 607 is formed at the bottom of the gap 108, connecting the gap 108 to the inlet path 610 and thus allowing for the circulation of fluid through the gap 108 as well. As is the case with the embodiments of FIGS. 2 and 5, the chuck 602 also includes a sealing ring 614 to prevent immersion fluid from coming between the bottom surface of the wafer 104 and the chuck 602.

Accordingly, in operation of the passively controlled chuck assembly 600, fluid passes by the first column (i.e., gap 108) and through the Venturi tube 607, which sucks fluid from the gap 108. Thereby, the excess fluid left over from the passing of the meniscus 110 over the gap 108 is removed from the gap 108. Thereafter, the excess fluid joins the inlet path 610 where it then flows over the lip 608 and into a drain (i.e., return path 612), thus maintaining the level of the fluid at the top surface of the chuck 602. Because the two columns (gap 108, second column 604) are connected (e.g., through passage 606) in zones of equal pressure at equal height, the fluid in the gap 108 will be maintained at the same level as that present in the second column 604. It will be noted that the flow of fluid within the chuck 602 need not be continuous, and may instead be made to occur at selected locations along the circumference of the chuck 602.

Thus configured, the passively controlled chuck assembly 600 allows for very fast control of fluid levels adjacent to the wafer 104, by minimizing the topography that the meniscus 110 crosses in a stable manner. Since the Venturi tube 607 provides for circulation of immersion fluid through the chuck gap 108, contamination of the fluid is less likely to accumulate, which in turn results in a smaller probability of contaminant particles being deposited on the surface of the wafer 104. A second advantage of having a series of Venturi tubes 607 and connecting passages 606 at a specified intervals is that they provide for a method to prevent undue increase in fluid pressure in the gap 108 during chuck acceleration.

Figure 7:
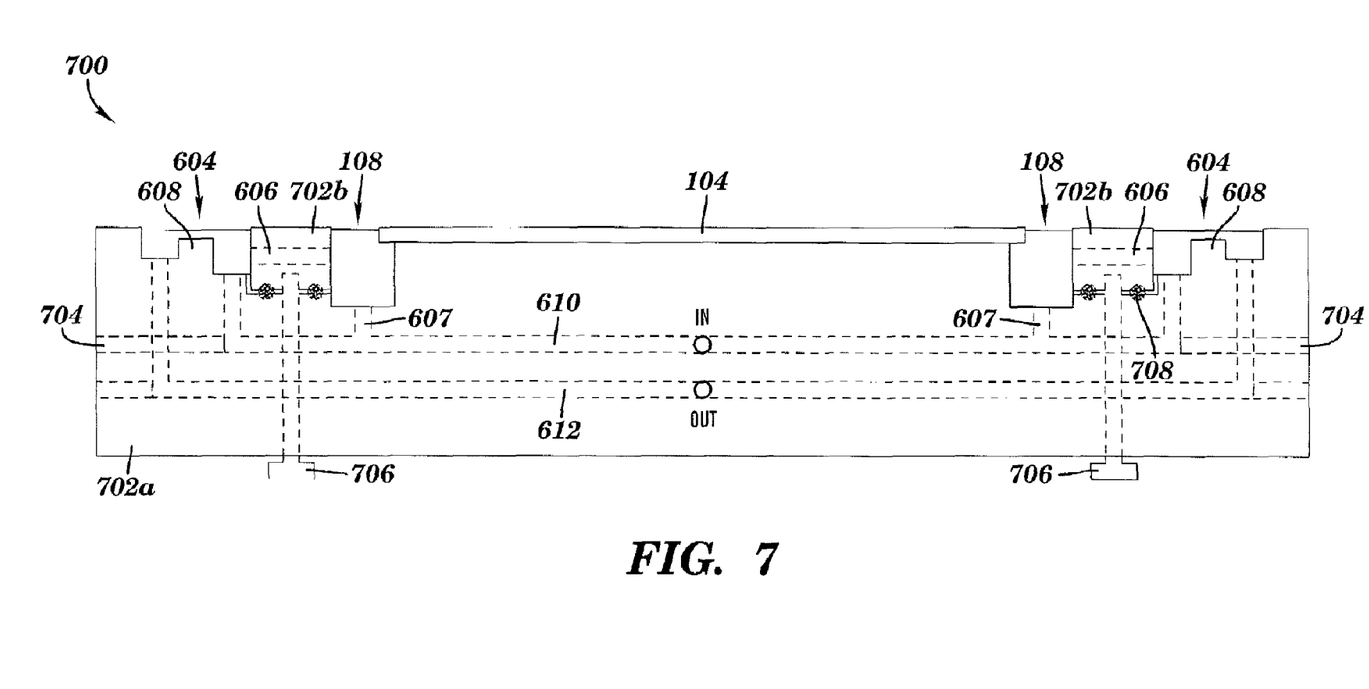
FIG. 7 is a cross-sectional view of a chuck assembly of the passive control type illustrated in FIG. 6, depicting an exemplary two-piece construction embodiment of the same.

By way of further illustration, FIG. 7 is a cross-sectional view of a chuck assembly 700 of the passive control type illustrated in FIG. 6, and depicts an exemplary two-piece construction embodiment of the same. As is shown, a first chuck section 702a includes the interior plumbing for the chuck, as well as the surface to which the wafer 104 is held. In particular, the first chuck section 702a includes the fluid inlet path 610 and return path 612 described above, as well as the Venturi tubes 607 at the bottom of the gap 108. Plugs 704 may be inserted into the first chuck section 702a to prevent the fluid from leaking outside the chuck.

Further, the first chuck section 702a is removably attached (e.g., by means of bolts 706) to a second chuck section 702b. The second chuck section 702b, once attached, also serves to define a barrier between the first column (gap 108) and the second column 604 for passive fluid level control. As can been seen, the second chuck section 702b also includes the interior passage 606 so as to bring the first and second columns in fluid communication with one another, and achieve the passive control of the gap fluid. O-rings 708 may also be used to seal the first and second chuck sections together, as also shown in FIG. 7. It will be noted that the detailed exemplary embodiment of FIG. 7 does not illustrate the sealing rings that prevent fluid from coming between the bottom of the wafer 104 and the first chuck section 702a.

Figure 8:
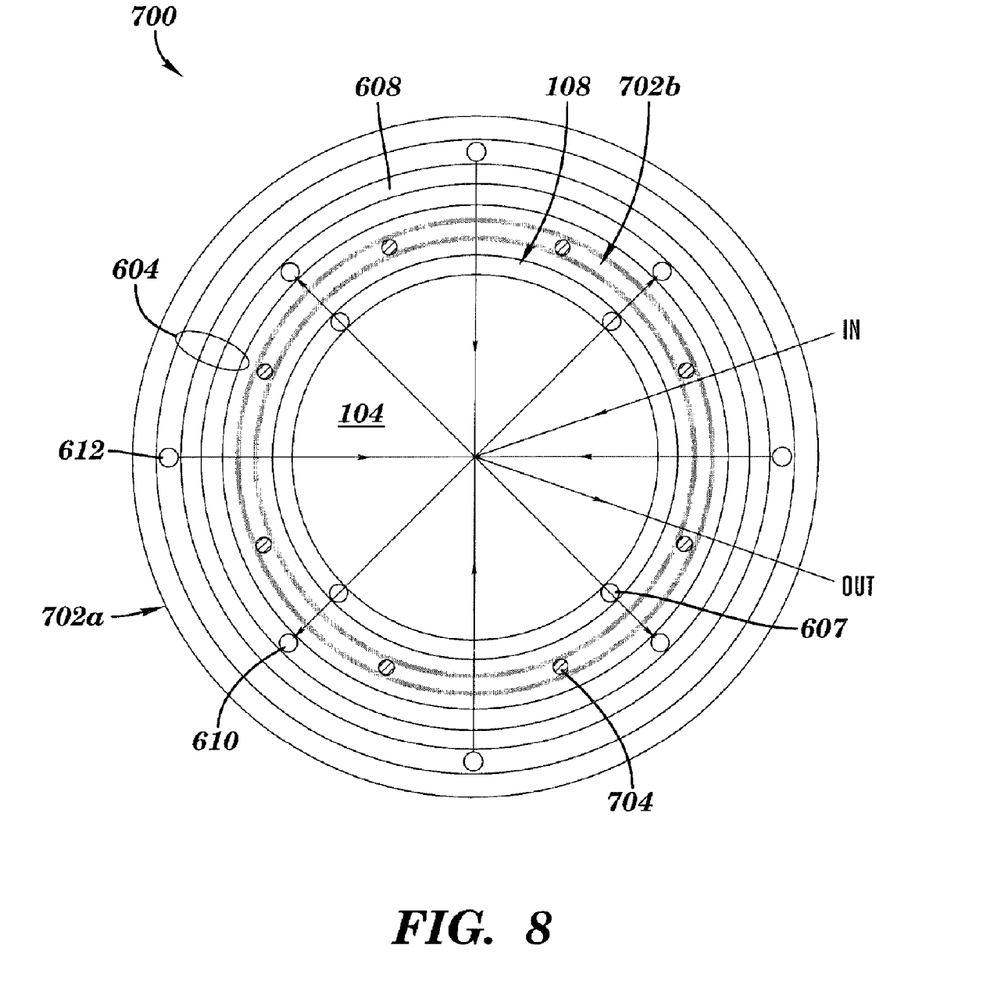
FIG. 8 is a top view of the chuck assembly of FIG. 7.

FIG. 8 is a top view of the chuck assembly 700 of FIG. 7. In addition to illustrating an exemplary fluid distribution path, FIG. 8 also shows one possible example of the relative number and positioning of inlet and outlet ports in the first column 604 with respect to the inlet and return fluid paths 610, 612. An exemplary distribution of Venturi tubes 607 within the gap 108 is further illustrated, although it will be appreciated that a different number and location of tubes can also be implemented.

As stated earlier, and regardless of the particular chuck assembly embodiment utilized, it is desirable to prevent immersion fluid (e.g., water) from getting beneath the wafer, between the bottom of the wafer and the chuck surface. More specifically, since there is vacuum holding down the wafer, the immersion fluid will have a tendency to seep towards the lower pressure. As such, it is advantageous to block this path by (for example) placing a sealing ring at the outer edge of the wafer support. To this end, several types and shapes of such a sealing ring are available, and from various materials.

Figure 9A:
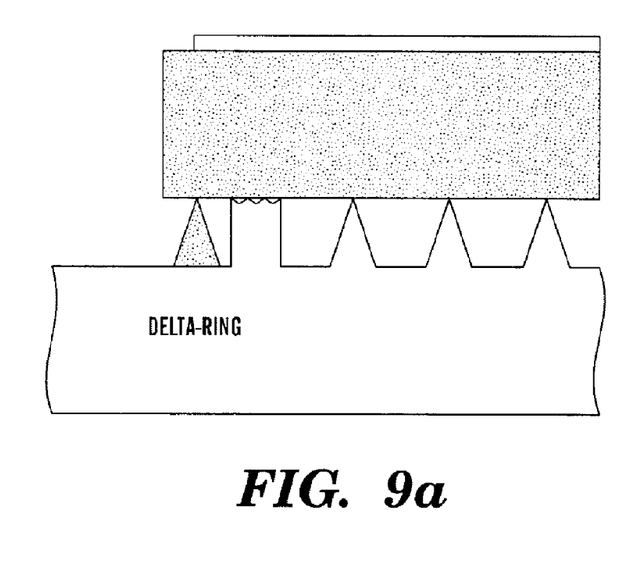
FIGS. 9(a) through 9(d) illustrate various possible cross-sectional shapes for sealing rings used in the chuck assembly embodiments.
Figure 9B:
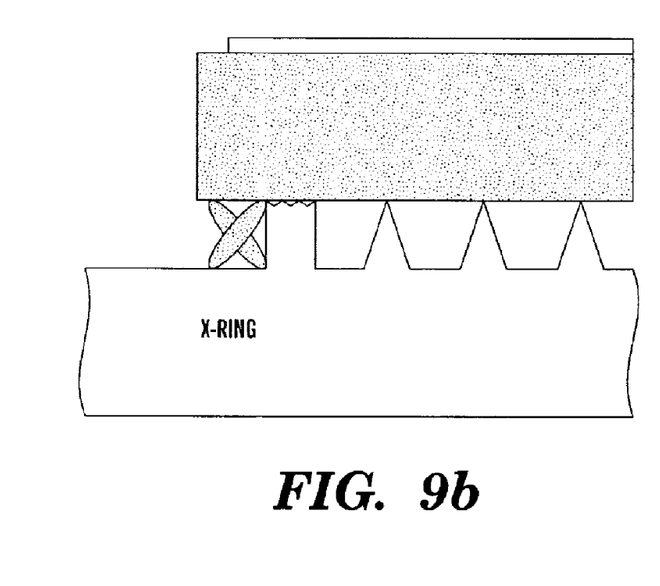
Figure 9C:
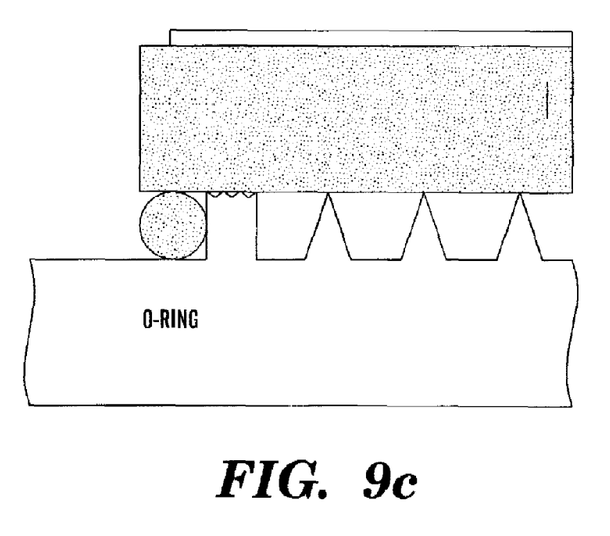
Figure 9D:
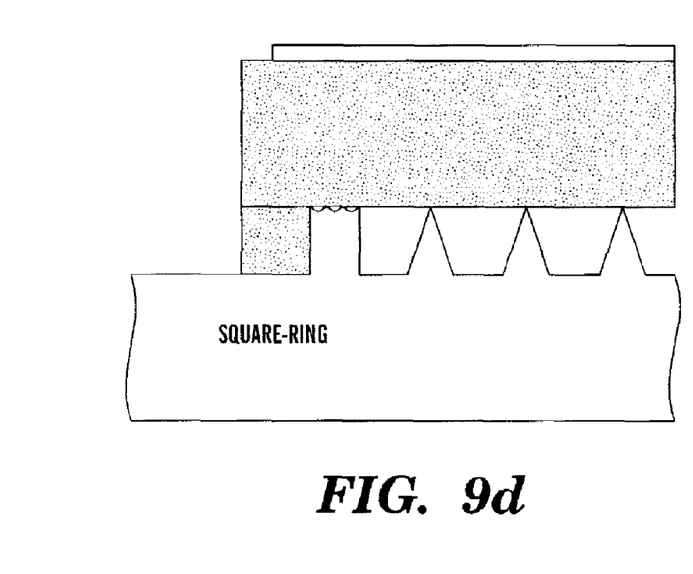

For example, FIGS. 9(a) through 9(d) illustrate various possible cross-sectional shapes for the sealing rings discussed above. In particular, the sealing ring may be of a delta shape as shown in FIG. 9(a), an X-shape as shown in FIG. 9(b); an O-ring as shown in FIG. 9(c); and a square ring as shown in FIG. 9(d). Other cross-sectional shapes, however, are also contemplated. Furthermore, the sealing rings may be made from any suitable material including, but not limited to: nitrile (buna), silicone, fluorosilicone, hydrogenated nitrile, fluorocarbon (e.g., Viton® by DuPont), neoprene, ethylene propylene, butyl, polyurethane, ethylene acrylic (e.g., Vamac® by DuPont), polyacrylate, and tetrafluoroethylene-propylene (e.g., Aflas® by Asahi Glass).

Figure 10:
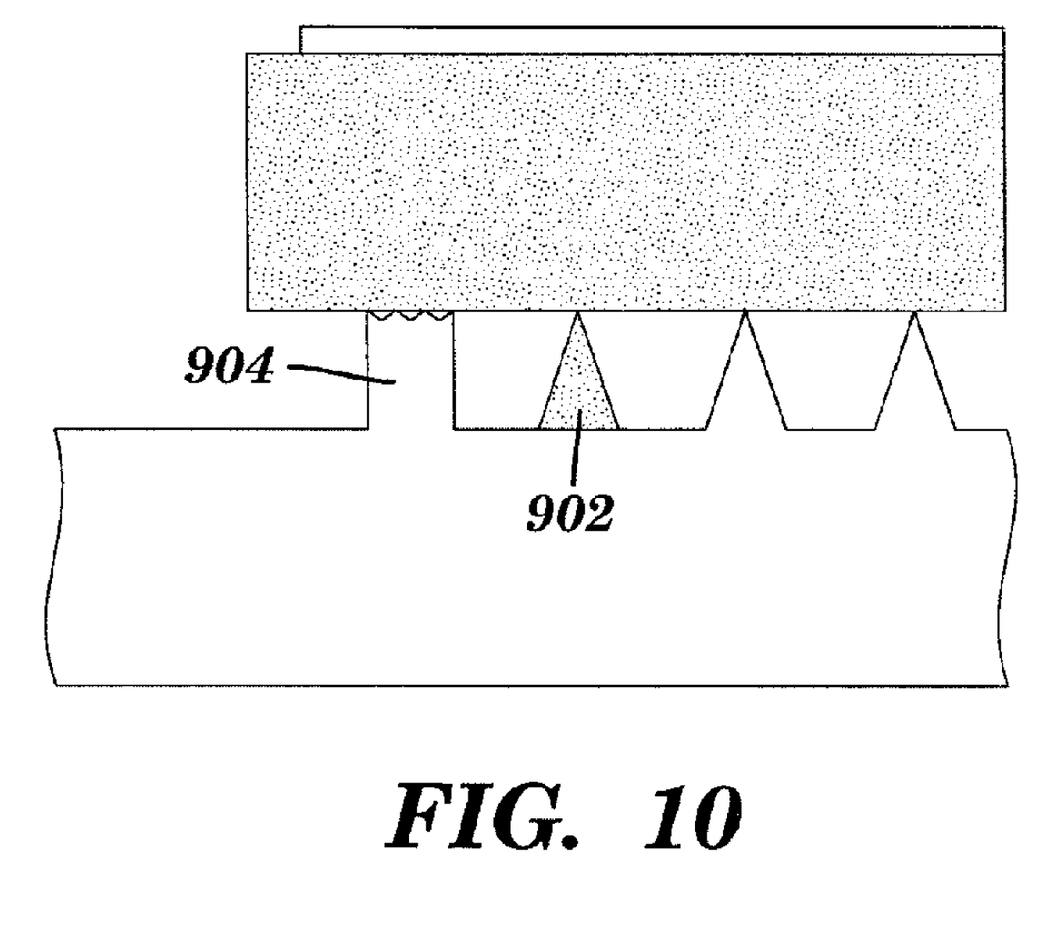
FIG. 10 depicts an alternate location of a sealing ring with respect to the wafer edge support portion of a chuck assembly.

Finally, FIG. 10 depicts an alternate location of the sealing ring 902 with respect to the wafer edge support portion 904 of a chuck assembly. Whereas the previously described embodiments illustrate the sealing ring positioned outside of the wafer edge support 904 (with respect to the center of the wafer), the sealing ring 902 in FIG. 10 is disposed on the inside of the wafer edge support 904. If the sealing ring 902 is located outside the wafer edge support, there is a small force present on the wafer (due to the positive external seal pressure) that could possible bend the wafer upwards and cause defocus errors near the edge of the wafer. Although this condition is less likely with small overlap distances between the wafer edge and the wafer edge support, the inside placement of the sealing ring 902 with respect to the wafer edge support 904 would eliminate any such deflection.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for reducing contamination in immersion lithography, comprising:
    a wafer chuck assembly including a wafer chuck configured to hold a semiconductor wafer on a support surface thereof;

said wafer chuck having a gap therein, said gap located adjacent an outer edge of the wafer, and said gap containing a volume of immersion lithography fluid therein; and a fluid circulation path configured within said wafer chuck so as to facilitate the radial outward movement of said immersion lithography fluid in said gap, thereby maintaining a meniscus of said immersion lithography fluid at a selected height with respect to a top surface of the semiconductor wafer, said fluid circulation path further comprising an inlet path through which pressurized fluid is introduced, and in communication with said immersion lithography fluid in said gap, and a return path through which excess immersion fluid from said gap is removed therefrom;

wherein said chuck further comprises a lip adjacent said gap and an outer channel adjacent said lip, said gap in fluid communication with said inlet path and said outer channel in communication with said return path, wherein excess immersion fluid in said gap travels radially outward from said gap, over said lip, and into said outer channel; and grooves formed within said lip, said one or more grooves configured to permit said immersion fluid to pass between said gap and said outer channel.

2. The apparatus of claim 1, further comprising a sealing ring disposed beneath the outer edge of the wafer, said sealing ring configured to prevent fluid from entering between the bottom of the wafer and said support surface of said chuck.

3. The apparatus of claim 2, wherein said sealing ring has a cross-section shape comprising one or more of: a delta shape, an 0 shape, an X shape, and a square shape.

4. The apparatus of claim 3, wherein said sealing ring comprises one or more of: a nitrile material, a buna material, a silicone material, a fluorosilicone material, a hydrogenated nitrile material, a fluorocarbon material, a neoprene material, an ethylene propylene material, a butyl material, a polyurethane material, an ethylene acrylic material, a polyacrylate material, and a tetrafluoroethylene-propylene material.

5. The apparatus of claim 2, wherein said sealing ring is disposed radially inward with respect to a wafer edge support of said chuck.

6. An apparatus for reducing contamination in immersion lithography, comprising:

a wafer chuck assembly including a wafer chuck configured to hold a semiconductor wafer on a support surface thereof;

said wafer chuck having a gap therein, said gap located adjacent an outer edge of the wafer, and said gap containing a volume of immersion lithography fluid therein; and a fluid circulation path configured within said wafer chuck so as to facilitate the radial outward movement of said immersion lithography fluid in said gap, thereby maintaining a meniscus of said immersion lithography fluid at a selected height with respect to a top surface of the semiconductor wafer, said fluid circulation path comprising an inlet path through which pressurized fluid is introduced, and in communication with said immersion lithography fluid in said gap, and a return path through which excess immersion fluid from said gap is removed therefrom, and wherein said chuck further comprises:

a lip disposed beneath said gap, said lip separating said inlet path and said return path; and a pressure sensor in communication with said fluid circulation path;

wherein excess immersion fluid in said gap travels radially outward from said gap, over said lip, and into said return path.

7. The apparatus of claim 6, wherein said pressure sensor is configured to provide active control of said immersion lithography fluid within said gap.

8. An apparatus for reducing contamination in immersion lithography, comprising:

a wafer chuck assembly including a wafer chuck configured to hold a semiconductor wafer on a support surface thereof;

said wafer chuck having a gap therein, said gap located adjacent an outer edge of the wafer, and said gap containing a volume of immersion lithography fluid therein; and a fluid circulation path configured within said wafer chuck so as to facilitate the radial outward movement of said immersion lithography fluid in said gap, thereby maintaining a meniscus of said immersion lithography fluid at a selected height with respect to a top surface of the semiconductor wafer, said fluid circulation path comprising an inlet path through which pressurized fluid is introduced, and in communication with said immersion lithography fluid in said gap, and a return path through which excess immersion fluid from said gap is removed therefrom, and wherein said chuck further comprises:

a first fluid column, defined by said gap;

a second fluid column, disposed radially outward with respect to said first fluid column;

said second fluid column including said inlet path and said return path passing therethrough; and a passage configured for fluidly connecting said first and said second fluid columns;

wherein said meniscus of said immersion lithography fluid is passively controlled through fluid level control within said second fluid column.

9. The apparatus of claim 8, wherein said chuck further comprises:

a lip disposed within said second fluid column, said lip separating said inlet path and said return path;

wherein excess immersion fluid in said second column travels radially outward from said gap, through said passage, over said lip within said second fluid column, and into said return path.

10. The apparatus of claim 9, further comprising a Venturi tube connection between said gap and said inlet path, said Venturi tube connection configured to draw said immersion fluid from said gap into said inlet path so as to facilitate circulation of said immersion fluid through said chuck.

* * * * *